(12) United States Patent
Wang et al.

(10) Patent No.: US 9,715,296 B2
(45) Date of Patent: Jul. 25, 2017

(54) SHIFT REGISTER UNIT, DRIVING METHOD THEREOF, GATE DRIVER CIRCUIT AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shijun Wang, Beijing (CN); Xiaochuan Chen, Beijing (CN); Lei Wang, Beijing (CN); Yanna Xue, Beijing (CN); Wenbo Jiang, Beijing (CN); Yue Li, Beijing (CN); Zhiying Bao, Beijing (CN); Zhenhua Lv, Beijing (CN); Wenjun Xiao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 85 days.

(21) Appl. No.: 14/764,066

(22) PCT Filed: Nov. 19, 2014

(86) PCT No.: PCT/CN2014/091685
§ 371 (c)(1),
(2) Date: Jul. 28, 2015

(87) PCT Pub. No.: WO2016/029569
PCT Pub. Date: Mar. 3, 2016

(65) Prior Publication Data
US 2016/0246418 A1 Aug. 25, 2016

(30) Foreign Application Priority Data

Aug. 28, 2014 (CN) .......................... 2014 1 0433475

(51) Int. Cl.
*G11C 19/00* (2006.01)
*G06F 3/041* (2006.01)
(Continued)

(52) U.S. Cl.
CPC .......... *G06F 3/0412* (2013.01); *G06F 3/0416* (2013.01); *G09G 3/20* (2013.01);
(Continued)

(58) Field of Classification Search
None
See application file for complete search history.

(56) References Cited

U.S. PATENT DOCUMENTS 9,218,779 B2 * 12/2015 Kim ..................... G09G 3/3696
2015/0346904 A1 * 12/2015 Long ................... G09G 3/3677
345/174

(Continued)

*Primary Examiner* — Tuan T Lam
(74) *Attorney, Agent, or Firm* — Harness, Dickey & Pierce, P.L.C.

(57) ABSTRACT

A shift register unit includes a pull-down maintenance module configured to pull down potentials at a pull-up node and a gate signal output end; a reset module configured to, at a touch stage within one frame of time, reset a potential of a signal from the gate signal output end to a potential of a fourth signal; a first signal output control module configured to, at a display stage within one frame of time, control a first signal output end to output a first common electrode signal, and at the touch stage within one frame of time, control the first signal output end to output a first signal input in the first signal input end. The first signal is a signal inputted at the touch stage to a common electrode connected to the shift register unit.

18 Claims, 4 Drawing Sheets

(51) Int. Cl.
*G11C 19/28* (2006.01)
*G09G 3/20* (2006.01)
*G11C 19/18* (2006.01)
*G09G 3/36* (2006.01)

(52) U.S. Cl.
CPC ......... *G09G 3/2096* (2013.01); *G11C 19/184* (2013.01); *G11C 19/28* (2013.01); *G09G 3/3677* (2013.01); *G09G 2310/0286* (2013.01); *G09G 2320/0219* (2013.01)

(56) References Cited

U.S. PATENT DOCUMENTS

| | | | |
|---|---|---|---|
| 2016/0260402 A1* | 9/2016 | Otose | G09G 3/3648 |
| 2016/0266700 A1* | 9/2016 | Ji | G09G 3/36 |
| 2016/0266702 A1* | 9/2016 | Yang | G09G 3/32 |
| 2016/0300542 A1* | 10/2016 | Zhang | G09G 3/3677 |

* cited by examiner

SHIFT REGISTER UNIT, DRIVING METHOD THEREOF, GATE DRIVER CIRCUIT AND DISPLAY DEVICE

CROSS-REFERENCE TO RELATED APPLICATION

The present application is the U.S. national phase of PCT Application No. PCT/CN2014/091685 filed on Nov. 19, 2014, which claims a priority of the Chinese patent application No. 201410433475.X filed on Aug. 28, 2014, which is incorporated herein by reference in its entirety.

TECHNICAL FIELD

The present disclosure relates to the field of display technology, in particular to a shift register unit, a driving method thereof, a gate driver circuit and a display device.

BACKGROUND

Along with an increase in people's living standards, there is a growing demand on the requirements of a display product, e.g., a high display quality and a thin product are required.

Currently, a one glass solution (OGS) touch panel or an on-cell touch panel is adopted by most of the display products. However, these touch panels are not conductive to make display products thinner. Hence, an in-cell touch panel has become a trend for the manufacture of the thin display product.

In an existing display product with an in-cell touch panel, there has developed a touch detection technology where an alternate current (AC) signal is used as a touch driving signal, i.e., at a touch sage within a time period, a high-potential touch driving signal (Tx_H) and a low-potential touch driving signal (Tx_L) are transmitted by a touch driving electrode alternately, so as to achieve a touch detection function of the touch panel.

Usually, a common electrode signal is at a potential of about 0.1V, while the touch driving signal is at a potential of 0-10V, so there may be a relative large voltage difference between the common electrode signal and the touch driving signal, and a coupling capacitance may occur between a common electrode and the touch driving electrode. As a result, a display effect of the display panel at the touch stage will be adversely affected in the case that light is emitted by individual pixel units.

Currently, the common electrode signal is supplied by a separate driver integrated circuit (IC), but it is impossible for an existing driver IC to enable the common electrode signal to be at different amplitudes at different stages, which thus results in a large restraint to amplitude of the touch driving signal. As a result, the display effect of the touch panel will be adversely affected.

SUMMARY

An object of the present disclosure is to provide a shift register unit, a driving method thereof, a gate driver circuit and a display device, so as to output by the shift register unit a signal received by a common electrode with no need to provide a separate driver IC in the display device for supplying a common electrode signal, thereby to simplify a structure of the display device and reduce the production cost thereof.

In one aspect, the present disclosure provides in one embodiment a shift register unit arranged inside an in-cell touch panel, and the in-cell touch panel includes a substrate on which a common electrode is arranged. The shift register unit includes a pre-charge module, a pull-up module, a pull-down maintenance module, a reset module, and a first signal output control module. The pull-down maintenance module is connected to a first control signal input end, a reset signal input end, a third signal input end, a fourth signal input end, a pull-up node and a gate signal output end, and configured to pull down potentials at the pull-up node and the gate signal output end, and the pull-up node is a point where the pre-charge module is connected to the pull-up module. The reset module is connected to a second control signal input end, the gate signal output end and a fourth signal input end, and configured to, at a touch stage within one frame of time, reset a potential of an output signal output from the gate signal output end to be a potential of a fourth signal input in the fourth signal input end. The first signal output control module is connected to the first control signal input end, the second control signal input end, a first common electrode signal input end, a first signal input end and a first signal output end, and configured to, at a display stage within one frame of time, control the first signal output end to output a first common electrode signal input in the first common electrode signal input end, and at the touch stage within one frame of time, control the first signal output end to output a first signal input in the first signal input end. The first signal is a signal inputted at the touch stage to a common electrode connected to the shift register unit.

Alternatively, the first signal is a second common electrode signal, a potential of which is an average of a potential of a high-potential touch driving signal and a potential of a low-potential touch driving signal.

Alternatively, when the common electrode is multiplexed by a touch driving electrode in the touch panel, the first signal is a touch driving signal.

Alternatively, the first signal output control module includes a first thin film transistor (TFT) and a second TFT. A first electrode of the first TFT is connected to the first common electrode signal input end, a gate electrode thereof is connected to the first control signal input end, and a second electrode thereof is connected to the first signal output end. A first electrode of the second TFT is connected to the first signal input end, a gate electrode thereof is connected to the second control signal input end, and a second electrode thereof is connected to the first signal output end.

Alternatively, the pre-charge module is connected to a start signal input end, a second signal input end and the pull-up node, and configured to charge the pull-up node using a second signal input in the second signal input end. The pull-up module is connected to a clock signal input end, the pull-up node and the gate signal output end, and configured to control the gate signal output end to output a gate driving signal. The pull-down maintenance module is configured to pull down the potentials at the pull-up node and the gate signal output end, and at a next time period, maintain the potentials at the pull-up node and the gate signal output end.

Alternatively, the pre-charge module includes a third TFT, a first electrode of which is connected to the second signal input end, a gate electrode of which is connected to the start signal input end, and a second electrode of which is connected to the pull-up node.

Alternatively, the pull-up module includes a fourth TFT and a storage capacitor. A first electrode of the fourth TFT is connected to the clock signal input end, a gate electrode thereof is connected to the pull-up node and a first end of the storage capacitor, and a second electrode thereof is connected to the gate signal output end and a second end of the storage capacitor.

Alternatively, the pull-down maintenance module includes a fifth TFT, a sixth TFT, a seventh TFT, an eighth TFT, a ninth TFT, a tenth TFT and an eleventh TFT. A first electrode of the fifth TFT is connected to the pull-up node, a gate electrode thereof is connected to the reset signal input end, and a second electrode thereof is connected to the third signal input end. A first electrode of the sixth TFT is connected to the pull-up node, a gate electrode thereof is connected to a gate electrode of the seventh TFT, a first electrode of the eighth TFT and a second electrode of the eleventh TFT, and a second electrode thereof is connected to the fourth signal input end. A first electrode of the seventh TFT is connected to the gate signal output end, and a second electrode thereof is connected to the fourth signal input end. A gate electrode of the eighth TFT is connected to the pull-up node, and a second electrode thereof is connected to the fourth signal input end. A first electrode of the ninth TFT is connected to a second electrode of the tenth TFT and a gate electrode of the eleventh TFT, a gate electrode thereof is connected to the pull-up node, and a second electrode thereof is connected to the fourth signal input end. A first electrode and a gate electrode of the tenth TFT are connected to the first control signal input end. A first electrode of the eleventh TFT is connected to the first control signal input end.

Alternatively, the reset module includes a twelfth TFT, a first electrode of which is connected to the gate signal output end, a gate electrode of which is connected to the second control signal input end, and a second electrode of which is connected to the fourth signal input end.

Alternatively, the TFTs are N-type TFTs, a first electrode of each TFT is a source electrode, and a second electrode of each TFT is a drain electrode.

Alternatively, a high level signal is inputted to the second signal input end, and a low level signal is inputted to the third signal input end; or a low level signal is inputted to the second signal input end, and a high level signal is inputted to the third signal input end.

Alternatively, the fourth signal is a low level signal.

In another aspect, the present disclosure provides in one embodiment a method for driving a shift register unit arranged inside an in-cell touch panel, and the in-cell touch panel includes a substrate on which a common electrode is arranged. The method includes steps of: in a first time period of a display stage within one frame of time, charging by a pre-charge module a pull-up node using a second signal input in a second signal input end; in a second time period of the display stage, controlling by a pull-up module a gate signal output end to output a gate driving signal; in a third time period of the display stage, discharging by a pull-down maintenance module the pull-up node and the gate signal output end; and in a fourth time period of the display stage, maintaining by the pull-down maintenance module potentials of the pull-up node and the gate signal output end.

The method further includes steps of: at the display stage within one frame of time, controlling by a first signal output control module a first signal output end to output a first common electrode signal input in a first common electrode signal input end; and at a touch stage within one frame of time, controlling by the first signal output control module the first signal output end to output a first signal input in the first signal input end, the first signal being a signal inputted at the touch stage to the common electrode connected to the shift register unit.

Alternatively, the first signal is a second common electrode signal, a potential of which is an average of a potential of a high-potential touch driving signal and a potential of a low-potential touch driving signal.

Alternatively, when some of the common electrodes are multiplexed by touch driving electrodes in the touch panel, the first signal is a touch driving signal.

Alternatively, in the first time period, a high level signal is inputted to a start signal input end, a low level signal is inputted to a clock signal input end and a reset signal input end, and a low level signal is outputted by the gate signal output end. In the second time period, a high level signal is inputted to the clock signal input end, a low level signal is inputted to the start signal input end and the reset signal input end, and a high level signal is outputted by the gate signal output end. In the third time period, a high level signal is inputted to the reset signal input end, a low level signal is inputted to the start signal input end and the clock signal input end, and a low level signal is outputted by the gate signal output end. In the fourth time period, a high level signal is inputted to the clock signal input end, a low level signal is inputted to the start signal input end and the reset signal input end, and a low level signal is outputted by the gate signal output end. At the display stage, a high level signal is inputted to a first control signal input end, and a low level signal is inputted to a second control signal input end. At the touch display, a low level signal is inputted to the first control signal input end, and a high level signal is inputted to the second control signal input end.

In yet another aspect, the present disclosure provides in one embodiment a gate driver circuit including a plurality of levels of the above-mentioned shift register units. Except for a first-level shift register unit, a start signal input end of each shift register unit is connected to a signal output end of a previous-level shift register unit, and except for a last-level shift register unit, a reset signal input end of each shift register unit is connected to a signal output end of a next-level shift register unit.

In still yet another aspect, the present disclosure provides in one embodiment a display device including the above-mentioned gate driver circuit.

According to the shift register unit, its driving method, the gate driver circuit and the display device in the embodiments of the present disclosure, the shift register unit includes the pull-down maintenance module configured to pull down the potentials at the pull-up node and the gate signal output end; the reset module configured to, at the touch stage within one frame of time, reset the potential of the output signal output from the gate signal output end to the potential of the fourth signal; and the first signal output control module configured to, at the display stage within one frame of time, control the first signal output end to output the first common electrode signal, and at the touch stage within one frame of time, control the first signal output end to output the first signal input in the first signal input end. The first signal is a signal inputted at the touch stage to the common electrode connected to the shift register unit. As a result, the shift register unit can output a signal received by the common electrode with no need to provide a separate driver IC in the display device for supplying a common electrode signal, thereby to simplify a structure of the display device and reduce the production cost thereof.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in one embodiment a shift register unit arranged inside an in-cell touch panel, and the in-cell touch panel includes a substrate on which a common electrode is arranged.

Figure 1:
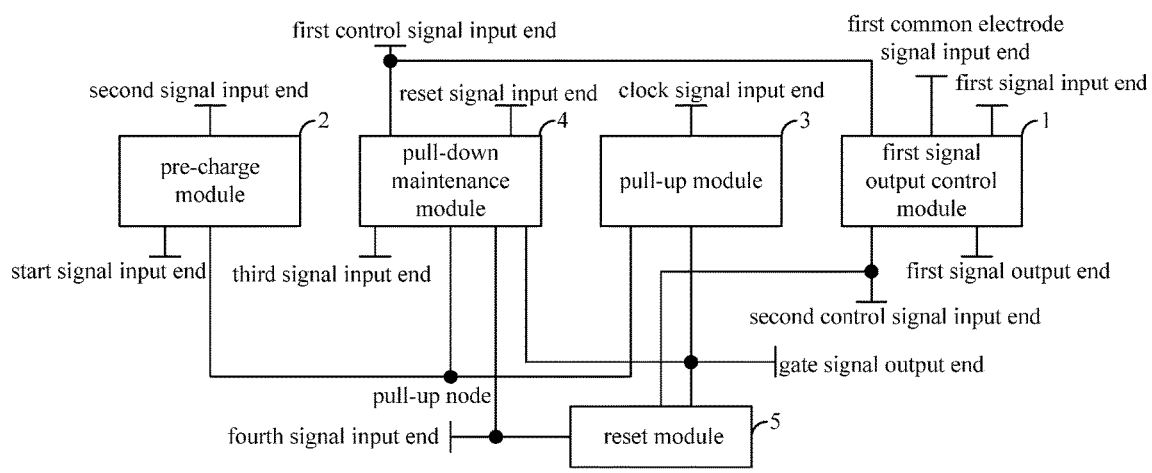
FIG. 1 is a schematic view showing a shift register unit according to one embodiment of the present disclosure.

As shown in FIG. 1, the shift register unit may include a first signal output control module 1, a pre-charge module 2, a pull-up module 3, a pull-down maintenance module 4 and a reset module 5.

The pull-down maintenance module 4 is connected to a first control signal (GCH) input end, a reset signal (RESET) input end, a third signal input end, a fourth signal input end, a pull-up node (PU) and a gate signal output end (OUTPUT), and configured to pull down potentials at the pull-up node and the gate signal output end, and the pull-up node is a point where the pre-charge module 2 is connected to the pull-up module 3.

The reset module 5 is connected to a second control signal (GCL) input end, the gate signal output end and a fourth signal input end, and configured to, at a touch stage within one frame of time, reset a potential of an output signal output from the gate signal output end to be a potential of a fourth signal input in the fourth signal input end.

The first signal output control module 1 is connected to the first control signal input end, the second control signal input end, a first common electrode signal (VcomL) input end, a first signal input end and a first signal output end, and configured to, at a display stage within one frame of time, control the first signal output end to output a first common electrode signal input in the first common electrode signal input end, and at the touch stage within one frame of time, control the first signal output end to output a first signal input in the first signal input end. The first signal is a signal inputted at the touch stage to a common electrode connected to the shift register unit.

According to the shift register unit in the embodiment of the present disclosure, it is able to output a signal received by the common electrode with no need to provide a separate driver IC in the display device for supplying a common electrode signal, thereby to simplify a structure of the display device and reduce the production cost thereof.

In addition, in the shift register unit, the first control signal input end is multiplexed by the first signal output control module 1 and the pull-down maintenance module 4, and the second control signal input end is multiplexed by the first signal output control module 1 and the reset module 5. As a result, it is able to reduce the number of the signal input ends desired for the shift register unit, simply the structure of the shift register unit and reduce the process steps for manufacturing the shift register unit as well as the production cost thereof, thereby to further reduce the production cost of the display device.

The first common electrode signal involved in the embodiments of the preset disclosure may be a normal common electrode signal, i.e., a low-potential common electrode signal, so as to provide a reference common electrode voltage for driving a pixel, e.g., −0.1V.

The first signal involved in the embodiments of the present disclosure may be a second common electrode signal (VcomH), i.e., a high-potential common electrode signal, and a potential of the second common electrode signal is an average of a potential of a high-potential touch driving signal (Tx_H) and a potential of a low-potential touch driving signal (Tx_L), i.e., VcomH=(Tx_H+Tx_L)/2.

When the low-potential touch driving signal is of a potential of 1V and the high-potential touch driving signal is of a potential of 9V, at the touch stage, the potential of the second common electrode signal output from the first signal output end in the shift register unit may be (1V+9V)/2=5V, so there is a voltage difference of 4V between the second common electrode signal and the low-potential/high-potential touch driving signals. As compared with a voltage difference of (9V−0.1V=8.9V) between the first common electrode signal (0.1V) and the high-potential touch driving signal (9V), it is able to reduce the voltage difference between the common electrode signal and the touch driving signal, thereby to reduce, and even prevent, the coupling capacitance between the common electrode and the touch driving electrode. As a result, it is able to prevent a display effect of the touch panel from being adversely affected when a pixel unit emits light at the touch stage, thereby to ensure a display effect of the display device at the touch stage.

In an alternative embodiment, the shift register unit may also be adapted to a touch panel where the common electrode is multiplexed as the touch driving electrode.

To be specific, the common electrode being multiplexed as the touch driving electrode means that, the common electrode in the touch panel may receive the common electrode signal at the display stage within one frame of time so as to enable the common electrode to provide a reference common electrode voltage for driving a pixel, i.e., the first common electrode signal of 0.1V, and it may receive the touch driving signal (TX), i.e., the first signal input in the first signal input end, at the touch stage within one frame of time, so as to use the common electrode as the touch driving electrode and enable the common electrode to interact with a touch sensing electrode spaced apart therefrom in a cross manner, thereby to achieve a touch detection function.

The shift register unit is driven in a time-division manner at the touch and display stages. As a result, it is able to, on one hand, form driver circuits for the display driving (generating the common electrode signal and the gate driving signal) and the touch driving (generating the touch driving signal) integrally, thereby to reduce the production cost of the display device, and on the other hand, reduce the mutual interference between the display driving and the touch detection, thereby to improve the image quality and the touch accuracy.

Figure 2:
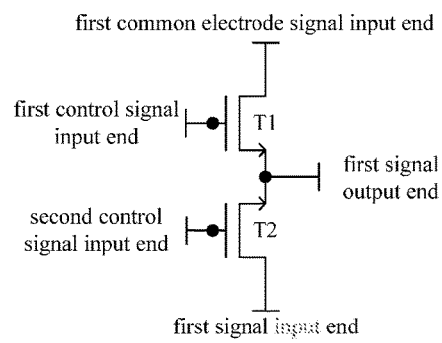
FIG. 2 is a schematic view showing a first signal output control module in the shift register unit according to one embodiment of the present disclosure.

In an alternative embodiment, as shown in FIG. 2, the first signal output control module 1 may include a first TFT T1 and a second TFT T2. A first electrode of the first TFT T1 is connected to the first common electrode signal input end, a gate electrode thereof is connected to the first control signal input end, and a second electrode thereof is connected to the first signal output end.

A first electrode of the second TFT T2 is connected to the first signal input end, a gate electrode thereof is connected to the second control signal input end, and a second electrode thereof is connected to the first signal output end.

Figure 3:
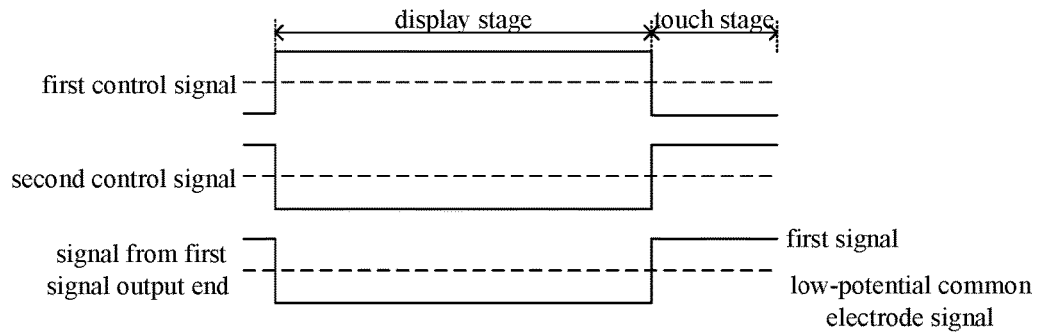
FIG. 3 is a signal timing diagram according to one embodiment of the present disclosure.

With respect to the circuit structure of the first signal output control module 1 in FIG. 2, a method for driving the shift register unit may control the first signal output control module 1 on the basis of a signal timing diagram in FIG. 3.

To be specific, at the display stage, a high level signal is inputted to the first control signal input end and a low level signal is inputted to the second control signal input end, so as to enable the first TFT T1 to be in an on state, enable the second TFT T2 to be in an off state, and enable a signal output from the first signal output end to be the first common electrode signal input in the first common electrode signal input end. The first common electrode signal may be used for the normal display of the pixel unit.

At the touch stage, a low level signal is inputted to the first control signal input end and a high level signal is inputted to the second control signal input end, so as to enable the first TFT T1 to be in the off state, enable the second TFT T2 to be in the on state, and enable a signal output from the first signal output end to be the first signal input in the first signal input end. The first signal may be the second common electrode signal of a potential of (Tx_H+Tx_L)/2, or the touch driving signal.

As shown in FIG. 1, the pre-charge module 2 may be connected to a start signal input end (INPUT), a second signal input end and the pull-up node, and configured to charge the pull-up node using a second signal input in the second signal input end.

As shown in FIG. 1, the pull-up module 3 may be connected to a clock signal (CLK) input end, the pull-up node and the gate signal output end, and configured to control the gate signal output end to output a gate driving signal.

The pull-down maintenance module 4 is configured to, in addition to pulling down the potentials at the pull-up node and the gate signal output end, maintain at a next time period the potentials at the pull-up node and the gate signal output end.

Figure 4:
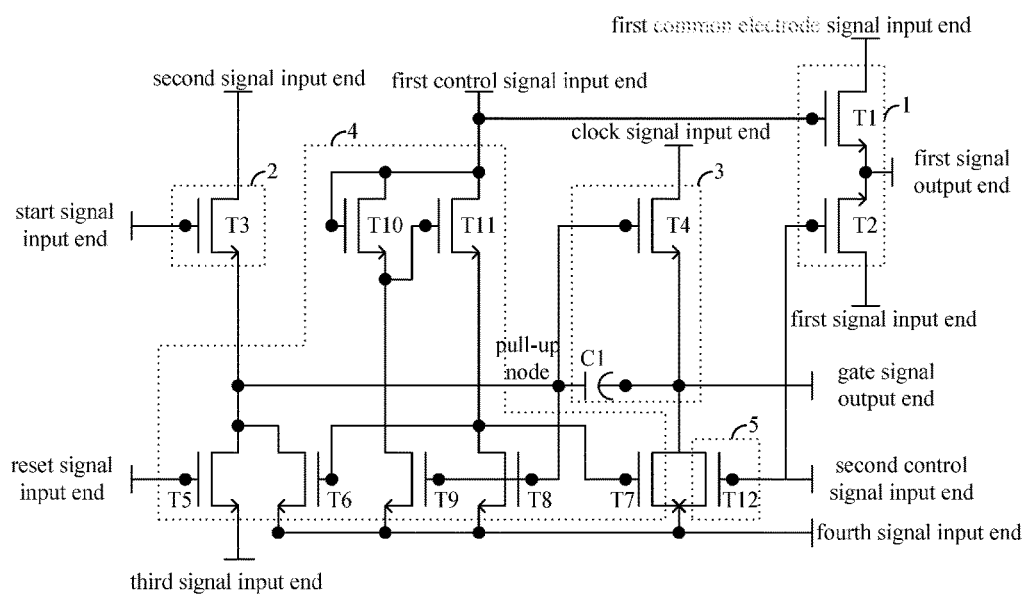
FIG. 4 is a schematic view showing a shift register unit according to another embodiment of the present disclosure.

As shown in FIG. 4, the pre-charge module 2 may include a third TFT T3, a first electrode of which is connected to the second signal input end, a gate electrode of which is connected to the start signal input end, and a second electrode of which is connected to the pull-up node.

As shown in FIG. 4, the pull-up module 3 includes a fourth TFT T4 and a storage capacitor C1. A first electrode of the fourth TFT T4 is connected to the clock signal input end, a gate electrode thereof is connected to the pull-up node and a first end of the storage capacitor C1, and a second electrode thereof is connected to the gate signal output end and a second end of the storage capacitor C1.

As shown in FIG. 4, the pull-down maintenance module 4 may include a fifth TFT T5, a sixth TFT T6, a seventh TFT T7, an eighth TFT T8, a ninth TFT T9, a tenth TFT T10 and an eleventh TFT T11.

A first electrode of the fifth TFT T5 is connected to the pull-up node, a gate electrode thereof is connected to the reset signal input end, and a second electrode thereof is connected to the third signal input end.

A first electrode of the sixth TFT T6 is connected to the pull-up node, a gate electrode thereof is connected to a gate electrode of the seventh TFT T7, a first electrode of the eighth TFT T8 and a second electrode of the eleventh TFT T11, and a second electrode thereof is connected to the fourth signal input end.

A first electrode of the seventh TFT T7 is connected to the gate signal output end, and a second electrode thereof is connected to the fourth signal input end.

A gate electrode of the eighth TFT T8 is connected to the pull-up node, and a second electrode thereof is connected to the fourth signal input end.

A first electrode of the ninth TFT T9 is connected to a second electrode of the tenth TFT T10 and a gate electrode of the eleventh TFT T11, a gate electrode thereof is connected to the pull-up node, and a second electrode thereof is connected to the fourth signal input end.

A first electrode and a gate electrode of the tenth TFT T10 are connected to the first control signal input end. A first electrode of the eleventh TFT T11 is connected to the first control signal input end.

As shown in FIG. 4, the reset module 5 may include a twelfth TFT T12, a first electrode of which is connected to the gate signal output end, a gate electrode of which is connected to the second control signal input end, and a second electrode of which is connected to the fourth signal input end.

The TFTs may be N-type TFTs, and at this time, a first electrode of each TFT may be a source electrode, and a second electrode of each TFT may be a drain electrode.

In an alternative embodiment, the second signal input end may be used to input a high level signal, e.g., a direct current (DC) high level signal VDD, and the third signal input end may be used to input a low level signal, e.g., a DC low level signal VSS, so as to drive the forward scanning of the touch panel, e.g., from top to bottom.

In another alternative embodiment, the second signal input end may also be used to input a low level signal, and the third signal input end may also be used to input a high level signal, so as to drive the backward scanning of the touch panel, e.g., from bottom to top.

The fourth signal is a low level signal, e.g., VGL. In other words, the fourth signal input end is a low level signal input end at a constant potential.

As shown in FIG. 3, the second control signal input end may be used to input a high level signal at the touch stage so as to enable the twelfth TFT T12, i.e., the reset module 5, in the on state, so the signal output from the gate signal output end is just the fourth signal input in the fourth signal input end. Because the fourth signal is a low level signal of a constant potential, the gate signal output end outputs a low level signal at the touch stage, so as to prevent the pixel unit from being charged and emitting light at the touch stage, thereby preventing the display effect of the display panel from being adversely affected and further ensuring the display effect of the display device at the touch stage.

Figure 5A:
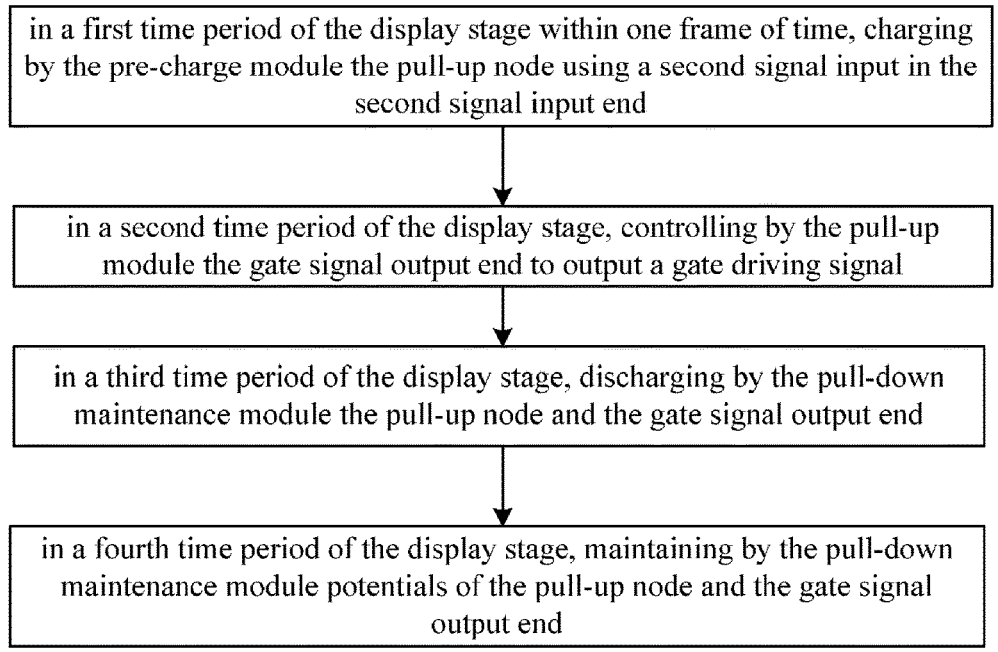
FIG. 5A is a flow chart of a method for driving the shift register unit according to one embodiment of the present disclosure.

With respect to the shift register unit in FIG. 4, as shown in FIG. 5A, the method for driving the shift register unit may further include steps of: in a first time period of the display stage within one frame of time, charging by the pre-charge module 2 the pull-up node using a second signal input in the second signal input end; in a second time period of the display stage, controlling by the pull-up module 3 the gate signal output end to output a gate driving signal; in a third time period of the display stage, discharging by the pull-down maintenance module 4 the pull-up node and the gate signal output end; and in a fourth time period of the display stage, maintaining by the pull-down maintenance module 4 potentials of the pull-up node and the gate signal output end.

Figure 5B:
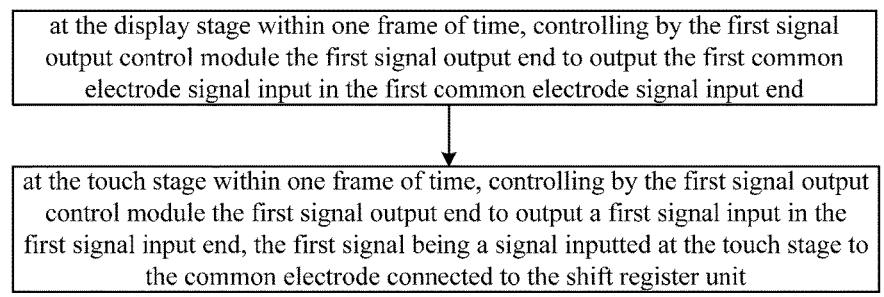
FIG. 5B is a flow chart of a method for driving the shift register unit according to another embodiment of the present disclosure.

As shown in FIG. 5B, the method may further include steps of: at the display stage within one frame of time, controlling by the first signal output control module the first signal output end to output the first common electrode signal input in the first common electrode signal input end; and at the touch stage within one frame of time, controlling by the first signal output control module the first signal output end to output a first signal input in the first signal input end, the first signal being a signal inputted at the touch stage to the common electrode connected to the shift register unit.

The procedure of driving the shift register unit in FIG. 4 by the above-mentioned method will be described hereinafter in conjunction with the sequence diagram in FIG. 6.

It should be appreciated that, in this embodiment, the first signal input end is the second common electrode signal input end, i.e., the first signal is the second common electrode signal. In FIG. 6, the second common electrode signal is a high-potential common electrode signal, the second signal input end is used to input a high level signal, and the third signal input end is used to input a low level signal.

Figure 6:
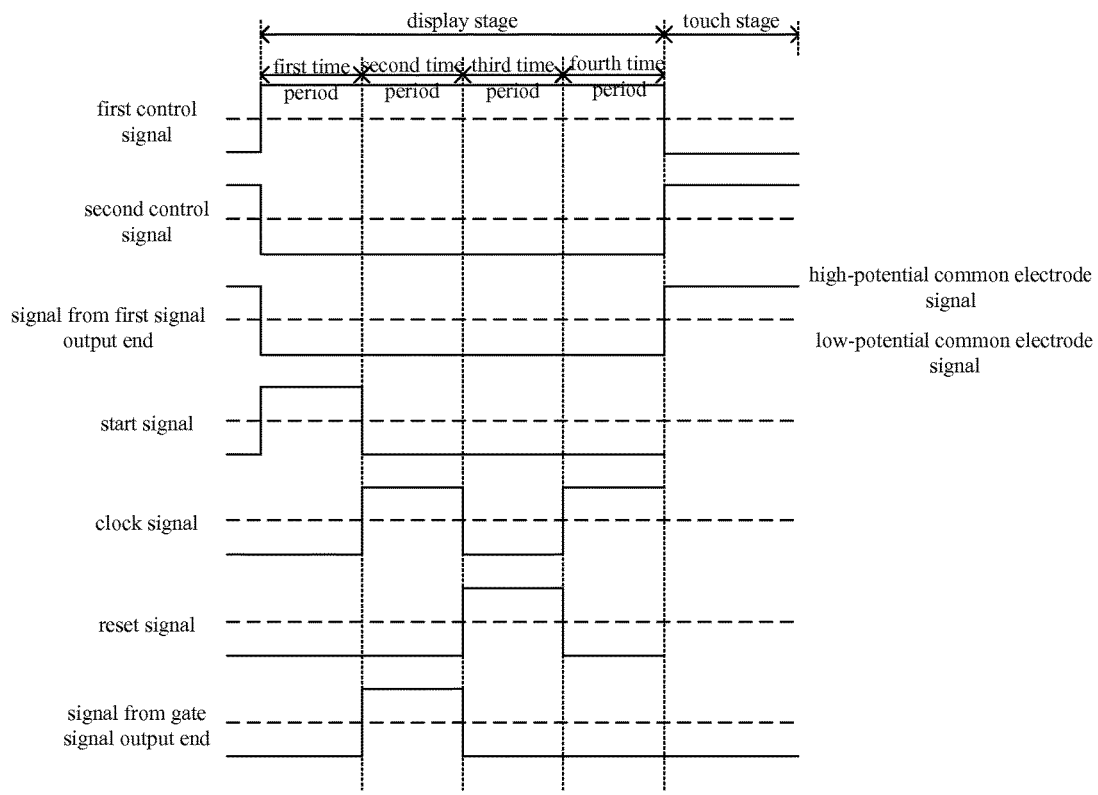
FIG. 6 is another signal timing diagram according to one embodiment of the present disclosure.

The timing sequences of the first control signal and the second control signal in FIG. 6 are identical to those in FIG. 3, so the operation of the first signal output control module 1 is similar to that mentioned above, and thus will not be repeated herein. Operations of other functional modules in the shift register unit will be described hereinafter.

In the first time period of the display stage, a high level signal is inputted to the start signal input end, a low level signal is inputted to the reset signal input end, and a low level signal is inputted to the clock signal input end. Due to the high level signal inputted to the start signal input end, the third TFT T3, i.e., the pre-charge module 2, is in the on state, and the pull-up node, i.e., the storage capacitor C1, is charged by the second signal, e.g., the DC high level signal VDD, input in the second signal input end. In this time period, the pull-up node controls the fourth TFT T5 to be in the on state, but the low level signal is inputted to the clock signal input end, so the signal output from the gate signal output end at the first time period is the low level signal inputted to the clock signal input end. The second control signal input end is always at a low potential at the display stage, so the twelfth TFT T12 is always in the off state at the display stage. In addition, in the first time period, a low level signal is inputted to the reset signal input end, so the fifth TFT T5 is in the off state.

In the second time period of the display stage, a high level signal is inputted to the clock signal input end, and a low level signal is inputted to the start signal input end and the reset signal input end. Due to the low level signal inputted to the start signal input end, the third TFT T3 is in the off state. In this time period, the pull-up node is still at the high potential, and the high level signal is inputted to the clock signal input end. The fourth TFT T4 continues to be in the on state due to a bootstrap effect of the storage capacitor, so the signal output from the gate signal output end is a clock signal at a high level, i.e., the gate driving signal, so as to enable a corresponding gate line to be in the on state.

In the third time period of the display stage, a low level signal is inputted to the start signal input end and the clock signal input end, and a high level signal is inputted to the reset signal input end. At this time period, the third TFT T3, the fourth TFT T4, the eighth TFT T8 and the ninth TFT T9 are all in the off state, and the fifth TFT T5, the sixth TFT T6 and the seventh TFT T7 are all in the on state, so as to discharge the pull-up node and the gate signal output end by the third signal input in the third signal input end and the fourth signal input in the fourth signal input end, thereby to enable the gate signal output end to output a low level signal.

In the fourth time period of the display stage, a high level signal is inputted to the clock signal input end, and a low level signal is inputted to the start signal input end and the reset signal input end. At this time period, the third TFT T3, the fourth TFT T4 and the fifth TFT T5 are all in the off state, and the sixth TFT T6, the seventh TFT T7, the tenth TFT T10 and the eleventh TFT T11 are all in the on state, so as to maintain the potentials at the pull-up node and the gate signal output end as unchanged.

At the touch stage, the high level signal is inputted to the second control signal input end so as to enable the twelfth TFT T12, i.e., the reset module 5, to be in the on state, so the signal output from the gate signal output end at the touch stage is just the fourth signal input in the fourth signal output end, i.e., a low level signal. In addition, at the touch stage, no signal is inputted to the start signal input end, the reset signal input end and the clock signal input end.

The operating states of the shift register unit at the display stage and the touch stage within one frame of time are described above. It can therefore be seen that, the shift register unit can not only output the gate signal and achieve a signal shift register function, but also provide the common electrode signal at different potentials at the display stage and the touch stage, thereby to ensure the display effect of the touch panel at the touch stage.

Based on the above-mentioned shift register unit, the present disclosure further provides in one embodiment a gate driver circuit. In the gate driver circuit, except for a first-level shift register unit, a start signal input end of each shift register unit is connected to a signal output end of a previous-level shift register unit, and except for a last-level shift register unit, a reset signal input end of each shift register unit is connected to a signal output end of a next-level shift register unit.

It should be appreciated that, for the plurality of levels of shift register units included in the gate driver circuit, some shift register units may be set as the shift register units mentioned above in accordance with the practical need, and the other shift register units may be identical to those known in the related art. For example, for the situation where the touch driving electrode corresponding to a plurality of gate lines, merely one shift register unit in the gate driver circuit may be set as the above-mentioned shift register unit.

The present disclosure further provides in one embodiment a display device including the above-mentioned gate driver circuit. The display device may be a liquid crystal panel, a liquid crystal TV, a liquid crystal display, an organic light-emitting diode (OLED) panel, an OLED display, a plasma display or an electronic paper.

The shift register unit, the gate driver circuit and the display device in the embodiments of the present disclosure are particularly suitable for a gate-on-array (GOA) circuit manufactured by a low temperature polysilicon (LTPS) or an a-Si process.

The shift register unit may include a-Si, poly-Si or oxide TFTs. it should be appreciated that, although n-type TFTs are taken as an example, p-type TFTs or complementary metal-oxide-semiconductor (CMOS) transistors may also be used in the above-mentioned circuit.

According to the shift register unit, its driving method, the gate driver circuit and the display device in the embodiments of the present disclosure, the shift register unit includes the pull-down maintenance module configured to pull down the potentials at the pull-up node and the gate signal output end; the reset module configured to, at the touch stage within one frame of time, reset the potential of the signal output from the gate signal output end to the potential of the fourth signal; and the first signal output control module configured to, at the display stage within one frame of time, control the first signal output end to output the first common electrode signal, and at the touch stage within one frame of time, control the first signal output end to output the first signal input in the first signal input end. The first signal is a signal inputted at the touch stage to the common electrode connected to the shift register unit. As a result, the shift register unit can output a signal received by the common electrode with no need to provide a separate driver IC in the display device for supplying a common electrode signal, thereby to simplify a structure of the display device and reduce the production cost thereof.

In addition, through the above-mentioned structure of the shift register unit, the process steps desired for manufacturing the shift register unit as well as the production cost thereof can be reduced, thereby to ensure the display effect of the display device at the display stage and the touch stage, and perform the image display and the touch detection in a better manner.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A shift register unit, which is arranged inside an in-cell touch panel, the in-cell touch panel comprising a substrate on which a common electrode is arranged, the shift register unit comprising a pre-charge module, a pull-up module, a pull-down maintenance module, a reset module, and a first signal output control module;
   wherein the pull-down maintenance module is connected to a first control signal input end, a reset signal input end, a third signal input end, a fourth signal input end, a pull-up node and a gate signal output end, and configured to pull down potentials at the pull-up node and the gate signal output end; the pull-up node is a point where the pre-charge module is connected to the pull-up module;
   the reset module is connected to a second control signal input end, the gate signal output end and a fourth signal input end, and configured to, at a touch stage within one frame of time, reset a potential of an output signal from the gate signal output end to be a potential of a fourth signal input in the fourth signal input end; and
   the first signal output control module is connected to the first control signal input end, the second control signal input end, a first common electrode signal input end, a first signal input end and a first signal output end, and configured to, at a display stage within one frame of time, control the first signal output end to output a first common electrode signal input in the first common electrode signal input end, and at the touch stage within one frame of time, control the first signal output end to output a first signal that is input in the first signal input end, the first signal is a signal inputted at the touch stage to a common electrode connected to the shift register unit.

2. The shift register unit according to claim 1, wherein the first signal is a second common electrode signal; a potential of the second common electrode signal is an average of a potential of a high-potential touch driving signal and a potential of a low-potential touch driving signal.

3. The shift register unit according to claim 1, wherein when the common electrode is used as a touch driving electrode in the touch panel, the first signal is a touch driving signal.

4. The shift register unit according to claim 1, wherein the first signal output control module comprises a first thin film transistor (TFT) and a second TFT;
   a first electrode of the first TFT is connected to the first common electrode signal input end, a gate electrode of the first TFT is connected to the first control signal input end, and a second electrode of the first TFT is connected to the first signal output end; and
   a first electrode of the second TFT is connected to the first signal input end, a gate electrode of the second TFT is connected to the second control signal input end, and a second electrode of the second TFT is connected to the first signal output end.

5. The shift register unit according to claim 1, wherein the pre-charge module is connected to a start signal input end, a second signal input end and the pull-up node, and configured to charge the pull-up node using a second signal input in the second signal input end;
   the pull-up module is connected to a clock signal input end, the pull-up node and the gate signal output end, and configured to control the gate signal output end to output a gate driving signal; and
   the pull-down maintenance module is configured to pull down the potentials at the pull-up node and the gate signal output end, and at a next time period, maintain potentials at the pull-up node and the gate signal output end.

6. The shift register unit according to claim 5, wherein the pre-charge module comprises a third TFT, a first electrode of which is connected to the second signal input end, a gate electrode of which is connected to the start signal input end, and a second electrode of which is connected to the pull-up node.

7. The shift register unit according to claim 5, wherein the pull-up module comprises a fourth TFT and a storage capacitor; and
   a first electrode of the fourth TFT is connected to the clock signal input end, a gate electrode of the fourth TFT is connected to the pull-up node and a first end of the storage capacitor, and a second electrode of the fourth TFT is connected to the gate signal output end and a second end of the storage capacitor.

8. The shift register unit according to claim 5, wherein the pull-down maintenance module comprises a fifth TFT, a sixth TFT, a seventh TFT, an eighth TFT, a ninth TFT, a tenth TFT and an eleventh TFT;
   a first electrode of the fifth TFT is connected to the pull-up node, a gate electrode of the fifth TFT is connected to the reset signal input end, and a second electrode of the fifth TFT is connected to the third signal input end;
   a first electrode of the sixth TFT is connected to the pull-up node, a gate electrode of the sixth TFT is connected to a gate electrode of the seventh TFT, a first electrode of the eighth TFT and a second electrode of the eleventh TFT, and a second electrode of the sixth TFT is connected to the fourth signal input end;
   a first electrode of the seventh TFT is connected to the gate signal output end, and a second electrode of the seventh TFT is connected to the fourth signal input end;
   a gate electrode of the eighth TFT is connected to the pull-up node, and a second electrode of the eighth TFT is connected to the fourth signal input end;
   a first electrode of the ninth TFT is connected to a second electrode of the tenth TFT and a gate electrode of the eleventh TFT, a gate electrode of the ninth TFT is connected to the pull-up node, and a second electrode of the ninth TFT is connected to the fourth signal input end;
   a first electrode and a gate electrode of the tenth TFT are connected to the first control signal input end; and
   a first electrode of the eleventh TFT is connected to the first control signal input end.

9. The shift register unit according to claim 5, wherein the reset module comprises a twelfth TFT, a first electrode of which is connected to the gate signal output end, a gate electrode of which is connected to the second control signal input end, and a second electrode of which is connected to the fourth signal input end.

10. The shift register unit according to claim 4, wherein the TFTs are N-type TFTs, a first electrode of each TFT is a source electrode, and a second electrode of each TFT is a drain electrode.

11. The shift register unit according to claim 5, wherein a high level signal is inputted to the second signal input end, and a low level signal is inputted to the third signal input end; or
   a low level signal is inputted to the second signal input end, and a high level signal is inputted to the third signal input end.

12. The shift register unit according to claim 5, wherein the fourth signal is a low level signal.

13. A method for driving a shift register unit, which is arranged inside an in-cell touch panel, the in-cell touch panel comprising a substrate on which a common electrode is arranged, the method comprising:
   in a first time period of a display stage within one frame of time, charging, by a pre-charge module, a pull-up node using a second signal input in a second signal input end;
   in a second time period of the display stage, controlling, by a pull-up module, a gate signal output end to output a gate driving signal;
   in a third time period of the display stage, discharging by a pull-down maintenance module, the pull-up node and the gate signal output end; and
   in a fourth time period of the display stage, by the pull-down maintenance module, potentials of the pull-up node and the gate signal output end;
   wherein the method further comprises:
   at the display stage within one frame of time, controlling, by a first signal output control module, a first signal output end to output a first common electrode signal input in a first common electrode signal input end; and
   at a touch stage within one frame of time, controlling, by the first signal output control module, the first signal output end to output a first signal that is input in the first signal input end, the first signal being a signal input at the touch stage to the common electrode connected to the shift register unit.

14. The method according to claim 13, wherein the first signal is a second common electrode signal, a potential of which is an average of a potential of a high-potential touch driving signal and a potential of a low-potential touch driving signal.

15. The method according to claim 13, wherein when some of the common electrodes are used as touch driving electrodes in the touch panel, the first signal is a touch driving signal.

16. The method according to claim 13, wherein in the first time period, a high level signal is inputted to a start signal input end, a low level signal is input to a clock signal input end and a reset signal input end, and a low level signal is output by the gate signal output end;
   in the second time period, a high level signal is input to the clock signal input end, a low level signal is input to the start signal input end and the reset signal input end, and a high level signal is output by the gate signal output end;
   in the third time period, a high level signal is input to the reset signal input end, a low level signal is input to the start signal input end and the clock signal input end, and a low level signal is output by the gate signal output end;
   in the fourth time period, a high level signal is input to the clock signal input end, a low level signal is input to the start signal input end and the reset signal input end, and a low level signal is output by the gate signal output end;
   at the display stage, a high level signal is input to a first control signal input end, and a low level signal is input to a second control signal input end; and
   at the touch stage, a low level signal is input to the first control signal input end, and a high level signal is input to the control signal input end.

17. A gate driver circuit comprising a plurality of levels of the shift register units according to claim 1, wherein except for a first-level shift register unit, a start signal input end of each shift register unit is connected to a signal output end of a previous-level shift register unit; and except for a last-level shift register unit, a reset signal input end of each shift register unit is connected to a signal output end of a next-level shift register unit.

18. A display device comprising the gate driver circuit according to claim 17.

* * * * *